(12) United States Patent
Cameron

(10) Patent No.: US 6,697,975 B2
(45) Date of Patent: Feb. 24, 2004

(54) GENERALIZED CONVOLUTIONAL INTERLEAVER/DEINTERLEAVER

(75) Inventor: Kelly Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/325,525

(22) Filed: Dec. 19, 2002

(65) Prior Publication Data

US 2003/0093750 A1 May 15, 2003

Related U.S. Application Data

(63) Continuation of application No. 09/430,456, filed on Oct. 29, 1999.
(60) Provisional application No. 60/106,482, filed on Oct. 30, 1998.

(51) Int. Cl.[7] .................. G11C 29/00; H03M 13/03
(52) U.S. Cl. .................. 714/702; 714/787; 714/788
(58) Field of Search .................. 714/701, 702, 714/787, 788, 761, 762

(56) References Cited

U.S. PATENT DOCUMENTS

| | | | |
|---|---|---|---|
| 4,547,887 A | | 10/1985 | Mui |
| 4,559,625 A | | 12/1985 | Berlekamp et al. |
| 5,042,033 A | * | 8/1991 | Costa .................. 714/701 |
| 5,241,563 A | * | 8/1993 | Paik et al. .................. 375/262 |
| 5,483,541 A | * | 1/1996 | Linsky .................. 714/701 |
| 5,519,734 A | * | 5/1996 | Ben-Efraim .................. 375/341 |
| 5,537,420 A | * | 7/1996 | Huang .................. 714/701 |
| 5,572,532 A | * | 11/1996 | Fimoff et al. .................. 714/702 |
| 5,592,492 A | | 1/1997 | Ben-Efraim et al. |
| 5,636,224 A | | 6/1997 | Voith et al. |
| 5,719,875 A | * | 2/1998 | Wei .................. 714/701 |
| 5,764,649 A | | 6/1998 | Tong |
| 5,771,239 A | * | 6/1998 | Moroney et al. .................. 370/474 |
| 5,886,998 A | | 3/1999 | Voith et al. |
| 5,889,791 A | | 3/1999 | Yang |
| 5,912,898 A | * | 6/1999 | Khoury .................. 714/701 |
| 6,003,147 A | * | 12/1999 | Stephens et al. .................. 714/701 |
| 6,014,761 A | | 1/2000 | Lachish et al. |
| 6,035,427 A | * | 3/2000 | Kweon .................. 714/702 |
| 6,178,530 B1 | * | 1/2001 | Aman et al. .................. 714/702 |
| 6,411,654 B1 | * | 6/2002 | Furutani et al. .................. 375/262 |

FOREIGN PATENT DOCUMENTS

| | | |
|---|---|---|
| EP | 0 681 373 A2 | 11/1995 |
| EP | 0 813 309 A2 | 12/1997 |
| GB | 2 315 002 A | 1/1998 |
| WO | WO 95/18489 | 7/1995 |

OTHER PUBLICATIONS

Hanna, S.A.; Convolutional interleaving for digital radio communications; Universal Personal Communications, 1993. Personal Communications: Gateway to the 21st Century. Conference Record, 2nd International Conference on, vol.: 1, 1993 Page(s): 443–447 v.*

S.A. Hanna, "Convolutional Interleaving for Digital Radio Communications," *Personal Communications: Gateway to the 21st Century, Conference Record, 2nd International Conference*, 1993, pp. 443–447, vol. 1, Universal Personal Communications.

* cited by examiner

*Primary Examiner*—Albert Decady
*Assistant Examiner*—Joseph D. Torres
(74) *Attorney, Agent, or Firm*—Christie, Parker & Hale, LLP

(57) ABSTRACT

A memory-efficient convolutional interleaver/deinterleaver with a memory array, a write commutator, and a read commutator wherein the commutators perform their respective write and read operations relative to a preselected memory cell after a predetermined delay. The delay is chosen using a modulo-based technique, such that an efficient implementation of a Ramsey Type-II interleaver is realized.

43 Claims, 2 Drawing Sheets

GENERALIZED CONVOLUTIONAL INTERLEAVER/DEINTERLEAVER

RELATED APPLICATION

This patent application is a continuation of application Ser. No. 09/430,456, filed Oct. 29, 1999, which claims the benefit of the filing date of U.S. Provisional Patent Application Serial No. 60/106,482, filed Oct. 30, 1998 and entitled EFFICIENT CONVOLUTIONAL INTERLEAVERS/DEINTERLEAVERS, the entire contents of which are hereby expressly incorporated by reference.

BACKGROUND OF THE INVENTION

1. Field of the Invention

The invention relates to an apparatus and method for convolutional interleaving/deinterleaving.

2. Description of the Relevant Art

Present digital communication channels are experiencing greatly increased demands, which lead to errors in the data being transmitted in that channel. The error correcting codes in common use are very good at detecting and correcting isolated bit errors which occur in a communication channel. However, typical error correction and detection codes are insufficient in a channel which is subject to burst-type errors, i.e., errors which will affect a large number of bits of data at a time.

Convolutional interleaving and de-interleaving techniques on either end of the channel transmission path are used to interleave the data stream, so that the effects of burst errors become distributed when the data stream is de-interleaved, and do not overwhelm the error correcting and detecting codes.

A balance often must be maintained among considerations such as, for example, the physical amount of memory used to realize the interleaver/deinterleaver, the total amount of device "real estate" available to the device designer, the device performance, device flexibility and dynamic re-programmability, and the simplicity of the device design and implementation. In applications where the importance of spatial efficiency is less important, the interleaver/deinterleaver can be implemented using an arbitrary number of memory cells, provided the requisite device performance characteristics are met. Often, interleavers/deinterleavers are realized using distinct designs and implementations, which can not be reconfigured dynamically to satisfy, for example, the demands of a different environment requiring the use of a different type of interleaver/deinterleaver.

The tension of this balance is most prominent in single-chip signal processing device implementations, where spatial efficiency can become a crucial consideration. There is a need for efficient implementations of certain types of interleavers/deinterleavers, including, for example, a Ramsey Type II device, which to date have not been demonstrated. Furthermore, there is a need for an interleaver/deinterleaver that can be dynamically reconfigurable among the different types of devices, for example, Ramsey I, Ramsey II, Ramsey III, and Ramsey IV.

SUMMARY OF THE INVENTION

The invention provides a memory-efficient convolutional interleaver/deinterleaver which includes a memory array, a write commutator, and a read commutator; wherein the commutators perform their respective write and read operations relative to a preselected memory cell after a predetermined delay. The delay is chosen using a technique, such as a modulo-based technique, such that an efficient implementation of a Ramsey Type-II interleaver, and a Ramsey Type-III is realized.

DETAILED DESCRIPTION OF EXEMPLARY EMBODIMENTS

Figure 1:
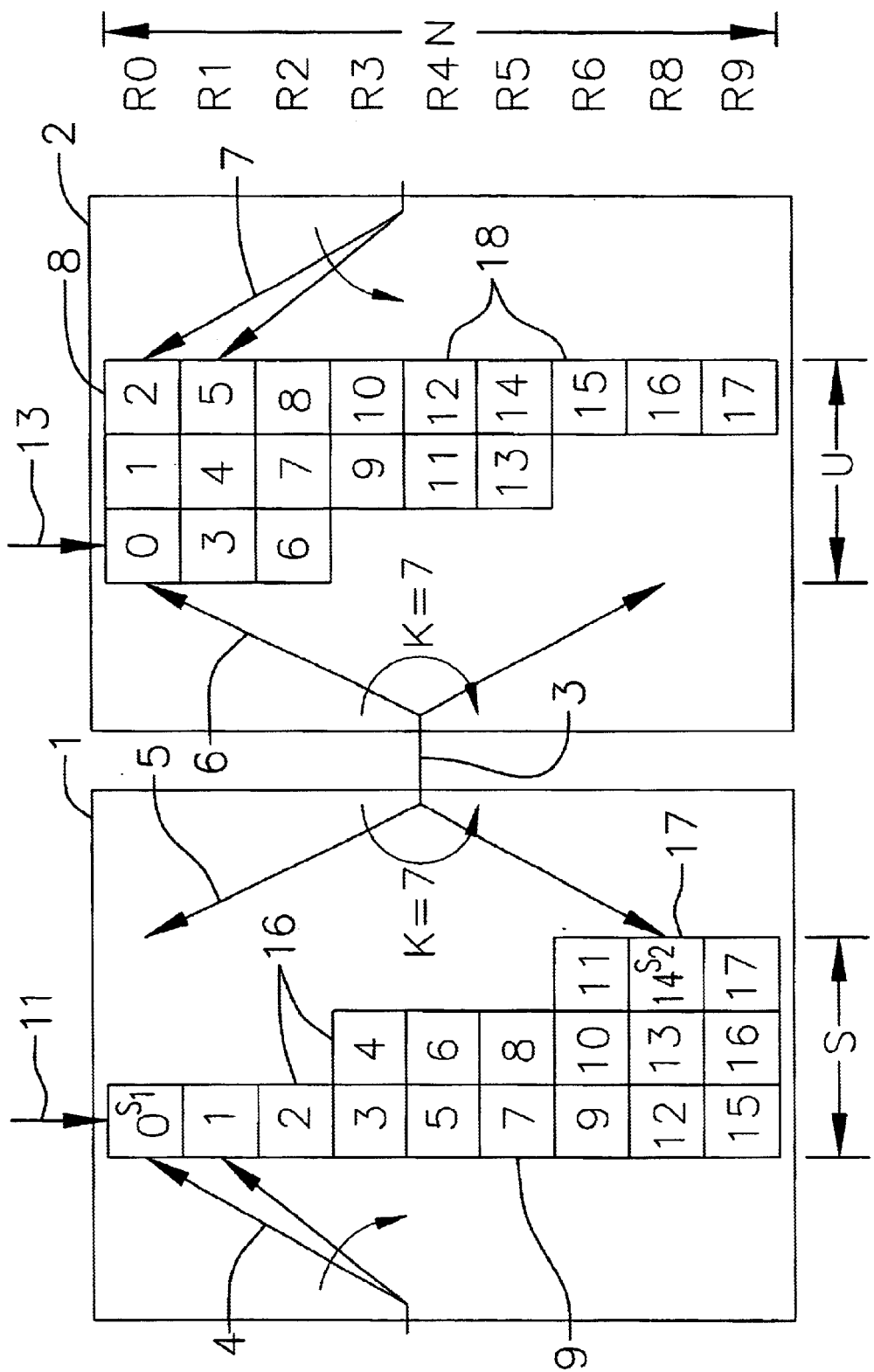
FIG. 1 is an exemplary illustration of an embodiment of the present invention, in the form of a Ramsey Type-II interleaver.

Although convolutional interleavers/deinterleavers are well known in the art, the design of memory-efficient devices approaching the theoretical minimum number of memory locations has been elusive, particularly interleavers/deinterleavers of the Ramsey II-type. The invention herein provides a generalized memory-efficient interleaver/deinterleaver that can be reconfigured to selectively operate as distinct devices, such as a Ramsey I-, Ramsey II-, Ramsey, III-, or Ramsey IV-type interleaver/deinterleaver. The implementation of the Ramsey-II type of device according to the present invention is substantially efficient, to the extent where such a design can approach a theoretical minimum number of memory cells.

The concept of convolutional interleaving was first introduced by J. L. Ramsey and G. D. Forney in around 1970. See, for example, J. L. Ramsey "Realization of Optimum Interleavers" IEEE Information Theory, Vol. IT-16, Number 3, May 1970, pp. 338–345; and G. D. Forney, "Burst-Correcting Codes for the Classic Bursty Channel," IEEE Trans. Communication Technology, Vol. COM-19, October 1971, pp. 772–781. When convolutional interleaving is used, the total memory requirements can theoretically be reduced to approximately $N*d$. The reduction in memory results in a memory requirement which is one-fourth the requirement of block interleaving. At the same time, the overall latency is reduced by up to approximately the same level (i.e., $N*d$). This is approximately half of the total latency of a block interleaver.

The implementations of convolutional interleaving described by Ramsey and Forney as well as others are capable of achieving the reduction of required memory by up to a factor of 4 through the use of $2*N$ separate delay lines. Each of the delay lines can be implemented by a RAM with its own address. However, when the number of symbols in a block of data N is relatively large, a correspondingly large number of separate RAMs are required in order to implement the interleaver. In order to improve the efficiency of the system, it would be desirable to consolidate these memories into a relatively small number of RAMs.

U.S. Pat. No. 4,559,625, entitled "Interleavers for Digital Communications," issued Dec. 17, 1985 to E. R. Berlekamp, et al. describes an interleaving system that requires only one RAM for the interleaver and one additional RAM for the deinterleaver. However, in the described implementation, which is referred to as "helical" interleaving, the interleaving depth d is restricted to a value that is one greater or one less than the number of symbols in a block of data N. That is, $D=N\pm1$. Although the "helical" interleaver disclosed by Berlekamp, et al. works well in some applications, it is limited in that it cannot be used in applications which require different relationships between the interleaving depth and the number of symbols in a block of data.

More recently, J. T. Aslanis, et al. described a convolutional interleaving system that permits an arbitrary interleaving depth d wherein the only restriction on the interleaving depth d is that it must be co-primed with the number of symbols in a block of data N. The described system uses a single RAM implementation with a total memory requirement equivalent to 2*N*d. See generally, Aslanis et al. "An ADSL Proposal for Selectable Forward Error Correction with Convolutional Interleaving", TIEI.4/92-180, Aug. 20, 1992. It should be appreciated that although this system requires just half of the memory required by the block interleaver, it still requires an amount of memory which is approximately twice as high as the theoretical minimum.

Also, U.S. Pat. No. 5,764,649, entitled, "Efficient Address Generation For Convolutional Interleaving Using A Minimal Amount Of Memory," issued Jun. 9, 1998 to Po Tong, describes an addressing scheme which uses a more reduced amount of memory in the interleaving and deinterleaving process, thereby achieving a significant savings in memory requirements. However, to realize this savings, a rather involved addressing scheme is required which involves generating several arrays which characterize the delays relating to each symbol, as well as the addresses for both the interleaver and the deinterleaver.

Each of the above described references is incorporated herein in its respective entirety.

The present invention provides a generalized, memory-efficient, convolutional interleaver/deinterleaver, the configuration of which can be dynamically selectable. For the purposes of clarity, and due to the duality between an interleaver and a deinterleaver, an interleaver/deinterleaver will be called an interleaver, as will be understood by skilled artisans. Also known to skilled artisans, a Ramsey Type-I interleaver is the dual of a Ramsey Type-II interleaver, and a Ramsey Type-III interleaver is the dual of a Ramsey Type-IV interleaver. Therefore, a Ramsey Type-I interleaver can be used as a deinterleaver when used in conjunction with a Ramsey Type-II interleaver.

In its most general form, an interleaver includes an array of memory cells, a write commutator and a read commutator. It is desirable for each of the commutators to have their positions relative to the previous position in memory cells updated, according to a preselected technique, at least one of which being a modulo-based technique. Where only one technique is a modulo-based, the other preselected technique can include updating the respective commutator by an offset of one or more positions, relative to the previous position in the memory cells.

FIG. 1 illustrates an exemplary embodiment of a Ramsey Type II interleaver/deinterleaver. As shown in FIG. 1, the present invention comprehends an interleaver 1, and a deinterleaver 2, that convey information through a data channel 3. Each of interleavers 1, 2 are shaped approximately like a triangular memory array. Interleaver 1 includes write commutator 4, read commutator 5, and plural rows 16, 17 of memory array 9. In general, each interleaver and deinterleaver have one write commutator and one read commutator. Interleaver 1 also includes row position pointer 11; it is desirable for each row 16, 17 in memory array 9 to have a row position pointer associated therewith. Deinterleaver 2 includes write commutator 6, read commutator 7, plural rows 18 of memory array 8, and row position pointer 13.

In the invention herein, memory locations can be referenced by row and row position. Typically, the row position is selected by the read/write commutator; and the position within a given row is selected by the row position pointer.

In this example, commutators 4, 6 are write commutators, and commutators 5, 7 are read commutators. For the purposes of clarity, the following exemplary process will be described from the perspective of interleaver 1; based on this information, a skilled practitioner can readily extend the process to deinterleaver 2. It is desirable, but not necessary, that commutators 4, 5 be initialized to the top row of the memory array. A symbol $S_1$ can be written at a first time to a first row 16 pointed to by write commutator 4. Also, symbol $S_2$ can be read at a second time, from second row 17 which is pointed to by read commutator 5. At this point, both pointers can be updated according to at least one predetermined update technique. It is desirable that read commutator 5 (and write commutator 6) be updated using a predetermined modulo technique. It is most desirable that a commutator "wraps" back on the array in an appropriate manner when the end of an array is reached.

Commutator updates can be made using many schemes, one being:

$$\text{CommutatorPos}_{i+1} = (\text{CommutatorPos}_i + H) \bmod N$$

where: rows are labeled $0 \leq R < N$; or K, where K is computed by solving the equation:

$$KD \bmod N = 1$$

It will be apparent to those skilled in the art that the difference between the second time and first time is representative of a predetermined delay that, in turn represents a preselected number of symbols $S_i$. Each row 16, 17 of memory array 9 can have a row position pointer 11 associated-therewith, by which, the memory location for symbol $B_i$ can be selected for a respective read or write operation. Initial access to row 16 can be performed to an arbitrary position within row 16. It also is desirable that a read operation update row position pointer 11.

Row position pointer 11 of a given row 16, 17 can be updated in conjunction with a read operation or a write operation. It is desirable to update row position pointer 11 in conjunction with a write operation when interleaving, and with a read operation when deinterleaving. Typically, read and write operations occur in pairs, with a read-after-write sequence being desirable. In such a case, row position pointer 11 can be post-incremented if it is updated in conjunction with a write operation, and pre-incremented if it is updated in conjunction with a read operation, with the reverse becoming a desirable sequence if the read operation precedes the write operation.

The row position increment operation can include any method of successively pointing to individual memory locations in a given row 16, 17. One such method can include:

$$\text{RowPos}+l = (\text{RowPos}_i + L) \bmod \text{RowSize}$$

where L is an integer such that:

$$\gcd(L, \text{Rowsize}) = 1$$

Other patterns and schemes may be used as well, for example, any such method which selects the elements in a given row, in any order. It is desirable that, once all elements have been selected, the selection sequence repeats.

Prior to a read operation row position pointer 11 is incremented using a preselected technique, such as, for example, a modulo technique, with the last position of a given row incrementing back to the first location of a row. The read operation is then performed from the location indicated by row position pointer 11. Where a write operation is used for updating, row position pointer 11 can be updated using a preselected modulo technique. In general, the modulo technique according to the present invention comprehends moving the appropriate commutator by a {modulo(number of rows)} displacement.

In the case of interleaver 1, write commutator 4 can be incremented by a fixed amount, or offset, for example, one position, after each write operation. When the last row of array 9 is reached, the commutator position wraps back around to the starting row of array 9 such that the entire cycle is repeated. Currently, it is desirable for read commutator 5 to be updated by K positions after each read operation. After successive read/write operations, the last row of the array is passed, and the position of read commutator 5 is updated by K rows. Using the desired interleaver block length N and interleave depth D, and interleave increment offset K can be computed by solving the equation:

$$KD \bmod N \equiv 1$$

Where memory array 9 consists of N rows of memory cells, and the index, R, of a logical sequential arrangement of the memory cells satisfies:

$$0 \leq R < N$$

starting with the top row, the size of each row in the logical arrangement can be given by:

$$S = \left\lfloor \frac{(D-1)}{N} R \right\rfloor + 1$$

where $\lfloor$ is the floor operator.

Similarly, the size of each row of the deinterleaver array can be given by:

$$U = \left\lfloor \frac{(D-1)}{N}(N-1-R) \right\rfloor + 1$$

As a result, the total number of memory locations, M, required to implement either the interleaver or the deinterleaver can be determined by:

$$M = \frac{(N-1)D + \gcd(N, D-1) + 1}{2}$$

where N and D are arbitrarily selectable parameters, as long as $$\gcd(N,D)=1.$$

The operation of deinterleaver 2 is logically similar to that of interleaver 1 in that write commutator 6 of deinterleaver 2 performs write operations on memory array 8 using an increment offset K for the repositioning of commutator 6, in the manner that read commutator 5 of interleaver 1 performs read operations on memory array 9 using the offset K for the repositioning of commutator 6.

In the case where rows are sequentially indexed, it is apparent that the length of the rows so configured either remains the same or increases, as a result of the floor operation function. Similarly, the length of the rows in deinterleaver 2 will remain the same or increase. There is no requirement that the logical configuration of the memory correspond with the physical configuration, so that it is possible to substitute one row for another row. However, it is desirable that the interchanged rows be of the same length.

Figure 2:
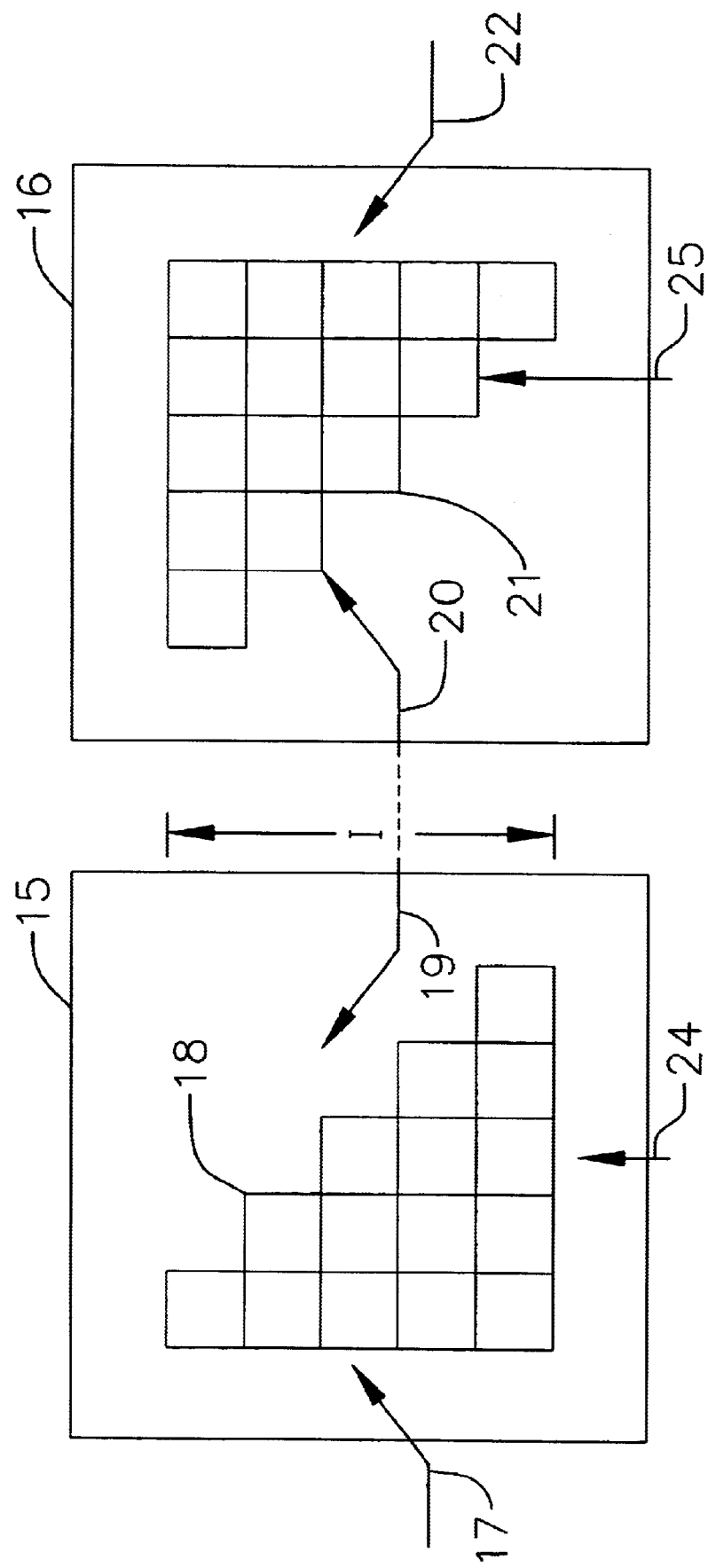
FIG. 2 is an exemplary illustration of an embodiment of the present invention, in the form of a Ramsey Type-III interleaver

FIG. 2 illustrates a Ramsey Type-III interleaver 15 and a Ramsey Type-IV device 16 as the corresponding de-interleaver. As with devices 1, 2, devices 15, 16 respectively employ write commutators 17, 20; read commutators 19, 22; and row position pointers 24, 25 to perform interleaving and deinterleaving in respective memory arrays 18, 21. Similar to the number of rows, N, in FIG. 1, devices 15, 16 are designed to use I rows of memory cells. As with interleavers 1, 2, the operation of commutators 19, 20, and perhaps, row position pointers 24, 25, can employ a selected modulo-based technique. It is most desirable that each of the commutators 17 and 22, and 19 and 20, and the row position pointers, 24, 25, be synchronized.

The foregoing merely illustrates the principles of the invention, and it will thus be appreciated that those skilled in the art will be able to devise various alternative arrangements which, although not explicitly described herein, embody the principles of the invention within the spirit and scope of the following claims.

What is claimed is:

1. A convolutional interleaver/deinterleaver comprising:
   a memory array having plural array cells, M, with selected array cells storing symbols therein, the memory array having a memory block length, N;
   an interleaver/deinterleaver having an interleave depth, D;
   a write commutator operably connected with the memory array for writing a symbol $B_i$ to a preselected memory cell at a first time; and
   a read commutator operably connected with the memory array for reading a symbol $B_i$ from the preselected memory cell at a a second time, wherein a difference between the second time and the first time is a predetermined delay, the predetermined delay being related a desired structure of the memory array, wherein one of the read commutator and the write commutator changes position using a predetermined technique;
   wherein M is determined by $$M = \frac{(N-1)D + \gcd(N, D-1) + 1}{2},$$

where $\gcd(N,D)=1$.

2. The convolutional interleaver/deinterleaver of claim 1, wherein the predetermined technique is a predetermined modulo technique, which comprises incementing the position of the one of the read commutator and the write commutator by K cells, wherein K satisfies the identity, $$KD \bmod N \equiv 1;$$

wherein D is the interleave depth, and N is the memory block length.

3. The convolutional interleaver/deinterleaver of claim 2, wherein the plural rows comprises a selected row, R, having a row length, L, determined by one of a. $L = \left\lfloor \frac{(D-1)}{N} R \right\rfloor + 1;$ and b. $L = \left\lfloor \frac{(D-1)}{N}(N-1-R) \right\rfloor + 1.$ 4. The convolutional interleaver/deinterleaver of claim 3, further comprising:

a. an interleaver selected row, $R_i$, having a row length, S, determined by $$S = \left\lfloor \frac{(D-1)}{N} R \right\rfloor + 1; \text{ and}$$

b. a deinterleaver selected row, $R_d$ having a row length, U, determined by $$U = \left\lfloor \frac{(D-1)}{N}(N-1-R) \right\rfloor + 1;$$

wherein $0 \leq R \leq N$.

5. The convolutional interleaver/deinterleaver of claim 4, wherein the predetermined delay is selectable among:
   a. (D−1) (i mod N) symbols, wherein gcd(D,D)=1
   b. (N) (i mod D) symbols, wherein D<N;
   c. (D−1) ((N−i−1) mod N) symbols, wherein gcd(N,D)=1; and
   d. (N) ((D−i−1) mod D) symbols, wherein D<N;
      wherein D is a predetermined interleave depth, and N is a predetermined memory block length.

6. The convolutional interleaver/deinterleaver of claim 5, wherein the commutator position of one of the read commutator and the write commutator increments prior to a read operation.

7. The convolutional interleaver/deinterleaver of claim 5, wherein the commutator position of one of the read commutator and the write commutator increments after a write operation.

8. The convolutational interleaver/deinterleaver of claim 2, wherein the predetermined modulo technique comprises incrementing the position of the other of the read commutator and the write commutator by one cell.

9. The convolutional interleaver/deinterleaver of claim 1, wherein one of the read commutator and the write commutator changes position using a predetermined finite difference equation technique.

10. A method for memory-efficient interleaving/ deinterleaving of data, comprising:
    providing a memory array having a plurality M of memory array cells to which symbols are to be stored;
    writing a symbol to a selected array cell of the memory array by a write commutator at a first time;
    selecting the memory array cell in which the symbol is stored; and
    reading the symbol from the selected memory array cell by a read commutator at a second time, the difference between the second time and the first time being a predetermined delay;
    wherein the plurality M of memory array cells is determined by:

$$M = \frac{(N-1)D + (gcd(N, D-1) + 1}{2},$$

and gcd(N,D)=1, D being an interleave depth, and N being a memory block length.

11. A pair of memory arrays, comprising:
    each memory array consisting of memory cells, the memory cells being organized as a two-dimensional array of rows and columns, wherein both memory arrays have a same number of rows N, and where the rows are numbered consecutively within each memory array;
    each memory array having two row reference pointers, pointing to rows within the memory array, and a column reference pointer, pointing to a column within the memory array;
    the first memory array being usable for convolutional interleaving of data, with the amount of columns in any row $R_i$ being determined by $$S = \left\lfloor \frac{(D-1)}{N} R_i \right\rfloor + 1,$$

wherein D is a desired interleave depth, N is the number of rows of either memory array, and i is the number of the row;

the second memory array being usable in conjunction with the first memory array for convolutional deinterleaving of the data, with the amount of columns in any row $R_d$ being determined by $$U = \left\lfloor \frac{(D-1)}{N}(N-1-R_d) \right\rfloor + 1,$$

wherein D is the desired interleave depth, N is the number of rows of either memory array, and d is the number of the row; and each memory array having a total size of no more memory cells than $$M = \frac{(N-1)D + gcd(N, D-1) + 1}{2};$$

wherein D is the desired interleave depth, and N is the number of rows of either memory array.

12. The pair of memory arrays of claim 11, wherein
    the column reference pointer in each memory array is used as a row position pointer;
    the first row reference pointer in each memory array is used as a write commutator, for writing a symbol $B_i$ to a memory cell, the memory cell being determined by the row position pointer and the first row reference pointer; and
    the second row reference pointer in each memory array is used as a read commutator, for reading a symbol $B_i$ from a memory cell, the memory cell being determined by the row position pointer and the second row reference pointer.

13. The pair of memory arrays of claim 12, wherein the difference between the time of writing a symbol $B_i$ to a memory cell and reading the symbol $B_i$ from the memory cell is a predetermined delay, the predetermined delay being related to a desired structure of the memory arrays.

14. The pair of memory arrays of claim 13, wherein the predetermined delay is a predetermined number of symbols accessed from the time of writing the symbol Bi until the time of reading the symbol $B_i$.

15. The pair of memory arrays of claim 14, wherein the predetermined number of accessed symbols is one of:

(D−1) (i mod N), wherein gcd(N, D)=1; N(i mod D), wherein D/N; (D−1) ((N−i−1) mod N), wherein gcd(N, D)=1; and N((D−i−1) mod D), wherein D/N;

wherein D is the desired interleave depth, N is the number of rows of either memory array, and i is the number of the row symbol $B_i$ has been written to.

16. The pair of memory arrays of claim 14, wherein the predetermined number of accessed symbols is selectable among:

(D−1) (1 mod N), wherein gcd(N, D)=1; N(i mod D), wherein D/N; (D−1) ((N−i−1) mod N), wherein gcd(N, D)=1; and N((D−i−1) mod D), wherein D/N;

wherein D is the desired interleave depth, N is the number of rows of either memory array, and i is the number of the row symbol $B_i$ has been written to.

17. The pair of memory arrays of claim 12, wherein the write commutator and the read commutator in each array change positions using a predetermined modulo technique.

18. The pair of memory arrays of claim 17, wherein the modulo technique comprises incrementing a position by K rows, where K is an integer number, K is greater than zero, and K satisfies the following equation:

$$KD \bmod N = 1,$$

wherein D is the desired interleave depth, and N is the number of rows of either memory array.

19. The pair of memory arrays of claim 12, wherein the write commutator and the read commutator in each array change positions after writing a symbol $B_i$.

20. The pair of memory arrays of claim 12, wherein the write commutator and the read commutator in each array change positions before reading a symbol $B_i$.

21. The pair of memory arrays of claim 12, wherein the row position pointer of the first memory array is updated when the write commutator changes position; and the row position pointer of the second memory array is updated when the read commutator changes position.

22. A memory array, comprising:

consisting of memory cells, the memory cells being organized as a two-dimensional array of rows and columns, and where the rows are numbered consecutively;

having two row reference pointers, pointing to rows within the memory array, and a column reference pointer, pointing to a column within the memory array;

the memory array being usable for convolutional interleaving of data, with the amount of columns in any row $R_i$ being determined by $$S = \left\lfloor \frac{(D-1)}{N} R_i \right\rfloor + 1,$$

wherein D is a desired interleave depth, N is the number of rows of the memory array, and i is the number of the row; and the memory array having a total size of no more memory cells than $$M = \frac{(N-1)D + \gcd(N, D-1) + 1}{2},$$

wherein D is the desired interleave depth, and N is the number of rows of the memory array.

23. The memory array of claim 22, wherein the column reference pointer is used as a row position pointer;

the first row reference pointer is used as a write commutator, for writing a symbol $B_i$ to a memory cell, the memory cell being determined by the row position pointer and the first row reference pointer; and the second row reference pointer is used as a read commutator, for reading a symbol $B_i$ from a memory cell, the memory cell being determined by the row position pointer and the second row reference pointer.

24. The memory array of claim 23, wherein the difference between the time of writing a symbol $B_i$ to a memory cell and reading the symbol $B_i$ from the memory cell is a predetermined delay, the predetermined delay being related to a desired structure of the memory array.

25. The memory array of claim 24, wherein the predetermined delay is a predetermined number of symbols accessed from the time of writing the symbol $B_i$ until the time of reading the symbol $B_i$.

26. The memory array of claim 25, wherein the predetermined number of accessed symbols is one of:

(D−1) (i mod N), wherein gcd(N, D)=1; N(i mod D), wherein D/N; (D−1) ((N−i−1) mod N), wherein gcd(N, D)=1; and N((D−i−1) mod D), wherein D/N;

wherein D is the desired interleave depth, N is the number of rows of the memory array, and i is the number of the row symbol $B_i$ has been written to.

27. The memory array of claim 25, wherein the predetermined number of accessed symbols is selectable among:

(D−1) (i mod N), wherein gcd(N, D)=1; N(i mod D), wherein D/N; (D−1) ((N−i−1) mod N), wherein gcd(N, D)=1; and N((D−i−1) mod D), wherein D/N;

wherein D is the desired interleave depth, N is the number of rows of the memory array, and i is the number of the row symbol $B_i$ has been written to.

28. The memory array of claim 23, wherein the write commutator and the read commutator change positions using a predetermined modulo technique.

29. The memory array of claim 28, wherein the modulo technique comprises incrementing a position by K rows, where K is an integer number, K is greater than zero, and K satisfies the following equation:

$$KD \bmod N = 1,$$

wherein D is the desired interleave depth, and N is the number of rows of the memory array.

30. The memory array of claim 23, wherein the write commutator and the read commutator change positions after writing a symbol $B_i$.

31. The memory array of claim 23, wherein the write commutator and the read commutator change positions before reading a symbol $B_i$.

32. The memory array of claim 23, wherein the row position pointer is updated when the write commutator changes position.

33. A memory array, comprising:

consisting of memory cells, the memory cells being organized as a two-dimensional array of rows and columns, and where the rows are numbered consecutively;

having two row reference pointers, pointing to rows within the memory array, and a column reference pointer, pointing to a column within the memory array;

the memory array being usable for convolutional deinterleaving of data, with the amount of columns in any row Rd being determined by $$U = \left\lfloor \frac{(D-1)}{N}(N-1-R_d) \right\rfloor + 1,$$

wherein D is the desired interleave depth, N is the number of rows of the memory array, and d is the number of the row; and the memory array having a total size of no more memory cells than $$M = \frac{(N-1)D + \gcd(N, D-1) + 1}{2},$$

wherein D is the desired interleave depth, and N is the number of rows of the memory array.

34. The memory array of claim 33, wherein the column reference pointer is used as a row position pointer;
the first row reference pointer is used as a write commutator, for writing a symbol $B_i$ to a memory cell, the memory cell being determined by the row position pointer and the first row reference pointer; and
the second row reference pointer is used as a read commutator, for reading a symbol $B_i$ from a memory cell, the memory cell being determined by the row position pointer and the second row reference pointer.

35. The memory array of claim 34, wherein the difference between the time of writing a symbol $B_i$ to a memory cell and reading the symbol $B_i$ from the memory cell is a predetermined delay, the predetermined delay being related to a desired structure of the memory array.

36. The memory array of claim 35, wherein the predetermined delay is a predetermined number of symbols accessed from the time of writing the symbol $B_i$ until the time of reading the symbol $B_i$.

37. The memory array of claim 36, wherein the predetermined number of accessed symbols is one of:

(D−1) (1 mod N), wherein gcd(N, D)=1; N(i mod D), wherein D/N; (D−1) ((N−i−1) mod N), wherein gcd(N, D) 1; and N((D−i−1) mod D), wherein D/N;

wherein D is the desired interleave depth, N is the number of rows of the memory array, and i is the number of the row symbol $B_i$ has been written to.

38. The memory array of claim 36, wherein the predetermined number of accessed symbols is selectable among:

(D−1) (1 mod N), wherein gcd(N, D)=1; N(i mod D), wherein D/N; (D−1) ((N−i−1) mod N), wherein gcd(N, D)=1; and N((D−i−1) mod D), wherein D/N;

wherein D is the desired interleave depth, N is the number of rows of the memory array, and i is the number of the row symbol $B_i$ has been written to.

39. The memory array of claim 34, wherein the write commutator and the read commutator change positions using a predetermined modulo technique.

40. The memory array of claim 39, wherein the modulo technique comprises incrementing a position by K rows, where K is an integer number, K is greater than zero, and K satisfies the following equation:

$KD \bmod N = 1,$ wherein D is the desired interleave depth, and N is the number of rows of the memory array.

41. The memory array of claim 34, wherein the write commutator and the read commutator change positions after writing a symbol $B_i$.

42. The memory array of claim 34, wherein the write commutator and the read commutator change positions before reading a symbol $B_i$.

43. The memory array of claim 34, wherein the row position pointer is updated when the read commutator changes position.

\* \* \* \* \*